US008248135B2

(12) United States Patent
Yu et al.

(10) Patent No.: US 8,248,135 B2
(45) Date of Patent: Aug. 21, 2012

(54) CIRCUIT INCLUDING CURRENT-MODE LOGIC DRIVER WITH MULTI-RATE PROGRAMMABLE PRE-EMPHASIS DELAY ELEMENT

(75) Inventors: Yue Yu, Duluth, GA (US); Han Bi, Atlanta, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/688,084

(22) Filed: Jan. 15, 2010

(65) Prior Publication Data
US 2011/0175656 A1 Jul. 21, 2011

(51) Int. Cl.
*H03H 11/26* (2006.01)
(52) U.S. Cl. ........................................ 327/274; 327/280
(58) Field of Classification Search .................. 327/274, 327/280
See application file for complete search history.

(56) References Cited

U.S. PATENT DOCUMENTS

| 6,686,787 B2 * | 2/2004 | Ling ............................. 327/203 |
| 6,753,727 B2 | 6/2004 | Magoon et al. |
| 2007/0052467 A1 * | 3/2007 | Cao ............................. 327/280 |

* cited by examiner

*Primary Examiner* — John Poos
(74) *Attorney, Agent, or Firm* — Roeder & Broder LLP

(57) ABSTRACT

A circuit (10) includes a circuit input (12), a circuit output (16) and a one or more delay elements (22) positioned between the circuit input (12) and the circuit output (16). The delay elements (22) each include a differential input pair (234), a latch stage (236) and a delay controller (244A1, 244A2, 244B1, 244B2). The delay controller (244A1, 244A2, 244B1, 244B2) selectively apportions current between the differential input pair (234) and the latch stage (236) to achieve a desired delay value for the circuit (10). The circuit (10) can also include a feedback loop (18) that calibrates a DC offset of the delay elements (22). The delay elements (22) can include two or more sets of resistive loads (238A, 238B) and a rate controller (241). The rate controller (241) controls an on/off state of the resistive loads (238A, 238B) to selectively switch between full resistance and half resistance. The rate controller (241) can also control the level of current ($I_1$, $I_2$) received by the differential input pair (234) and the latch stage (236) to control the delay value.

25 Claims, 4 Drawing Sheets

CIRCUIT INCLUDING CURRENT-MODE LOGIC DRIVER WITH MULTI-RATE PROGRAMMABLE PRE-EMPHASIS DELAY ELEMENT

BACKGROUND

Current-mode logic (CML) drivers are often employed as a key component of a transmitter in both ReDriver/ReTimer and Serializer/Deserializer (SERDES) applications for high speed serial links. These drivers more often than not provide the capability of pre-emphasizing a signal being transmitted to compensate for a frequency-dependent loss of the channel. This type of circuit consists of one main tap driver and one post tap driver, both of which typically are implemented as CML drivers. The post tap driver transmits data that is delayed from the main tap path data by one unit interval (UI) which is the inverse of the data rate.

This delayed-by-one-UI data is typically achieved with the help of an on-chip high speed clock that runs at a frequency which corresponds to the data rate. However, in the case where such a clock is not present, such as in a low cost, low power ReDriver application, additional effort is required to implement this delay element for the post tap driver. Furthermore, modern transceivers are often designed to support multiple standards and multiple data rates. For example, the delay provided by the delay cell needs to be programmable, i.e., if the data rate is 2.5 Gbps, the delay provided by the delay cell needs to be 400 ps; if the data rate is 6.25 Gbps, the delay needs to be 160 ps.

Another constraint for the delay cell is that the delay variation over PVT corners needs to be well controlled. If, on the transmitter side, the delay produced by the delay cell differs too much across corners from the nominal value determined by the data rate, it can greatly degrade the performance of receiver equalization.

DC offset is another problem faced by any chain-based delay generation circuit. With the scaling down of modern CMOS technology, the device geometric size is considerably shrinking which makes device mismatch more significant as it is inversely proportional to the square root of device area. A multi-stage delay chain can make matters worse as the input referred DC offset will be amplified by a chain of amplifiers to the extent that the resulting output referred offset could be comparable to data signal levels.

Conventional CMOS inverter based chain delay cell is the most common way of generating a delay but it usually has at least +/−50% variation over PVT corners without any sort of complicated calibration which makes it undesirable for this application. Another drawback is that the main signal flavor is mostly kept as CML in drivers so if the delay cell is CMOS based, extra circuits will be needed to convert signals back and forth between CML and CMOS.

Another attempted solution is to use multiple stage, cascaded conventional CML amplifiers. The concept is similar to that of an inverter chain delay solution while the difference is the delay variation over PVT corners now mainly comes from poly resistor and device/parasitic capacitance on the output node which usually varies to a lesser extent. Problems with this approach include the requirement of a relatively large number of stages to produce the UI delay for lower data rates. This translates to greater power consumption. Cascading more stages together also lowers the bandwidth of the entire delay chain which would introduce inter-symbol interference (ISI). Another problem with this approach includes the lack of programmability of delay values to support multiple data rates.

Conventional methods for dealing with amplifier chain offset include making the key transistors very large to achieve a decreased incidence of mismatch. This approach could either slow down the amplifier or increase the power consumption of the amplifier chain. Another known method is to perform a one-time calibration. One state machine will short both differential inputs of the amplifier chain and add a compensation force until the differential output voltage equals zero. The concept includes adding a calibration force against intrinsic device mismatch to re-gain the DC differential balance. One problem with this approach is that the calibration force required is frequency-dependent. Such a DC-wise calibration can have significant residue of the offset and can degrade the performance. It also does not track the change in offset introduced by PVT change.

SUMMARY

The present invention is directed toward a circuit that includes a circuit input, a circuit output and a first delay element. The first delay element is positioned between the circuit input and the circuit output. In one embodiment, the first delay element includes a differential input pair, a latch stage and a delay controller. The latch stage is positioned in parallel with the differential input pair. The delay controller selectively apportions current between the differential input pair and the latch stage to achieve a desired delay value for the circuit.

In one embodiment, the circuit also includes a second delay element that is substantially similar to the first delay element. In this embodiment, the second delay element can be positioned in series with the first delay element. In another embodiment, the circuit can also include a feedback loop that calibrates a DC offset of the delay element. The feedback loop can include at least one low pass filter and an auxiliary amplifier.

In another embodiment, the delay element can include two sets of resistive loads and a rate controller. In this embodiment, the rate controller selectively controls an on/off state of at least a portion of the resistive loads. Additionally, or in the alternative, the rate controller can control the resistive loads to selectively switch between full resistance and half resistance. Additionally, or in the alternative, the rate controller can control the level of current received by the differential input pair. In one embodiment, the rate controller is switchable between allowing full current or half current into the differential input pair.

In one embodiment, the latch stage includes gates that are cross-coupled to one another. Further, the delay controller can tunably apportion the current between the differential input pair and the latch stage depending upon the desired delay value. In certain embodiments, an increasing level of current directed to the latch stage directly correlates to a greater delay value.

The present invention is also directed toward a method for producing a desired delay value in a circuit.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

As an overview, the circuit illustrated and described herein includes a current-mode logic (CML) driver with one or more low power multi-rate programmable pre-emphasis delay elements that have low delay variation over process, supply voltage and temperature (PVT) corners. Additionally, the circuit can transparently provide continuous offset calibration without significantly disturbing the high speed signal path.

Figure 1:
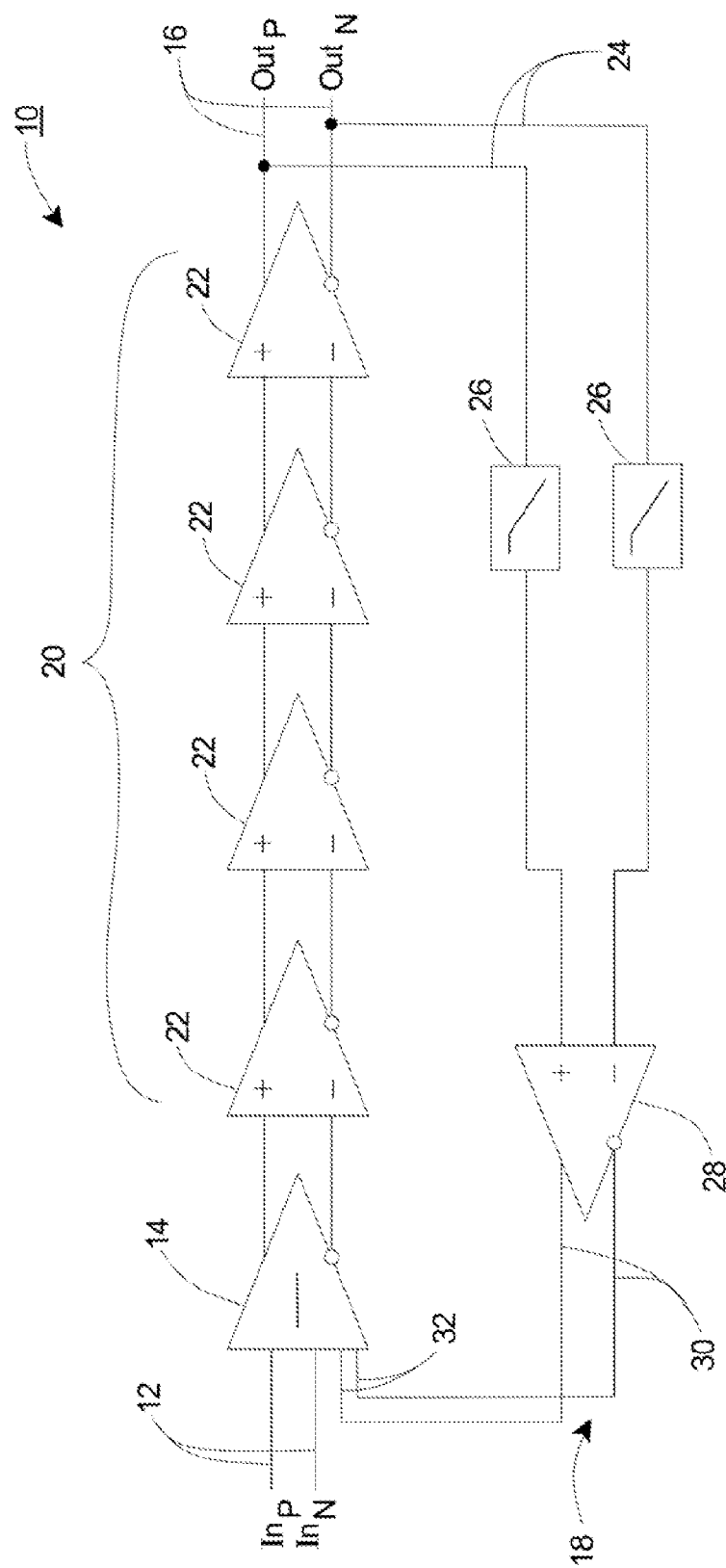
FIG. 1 is a schematic diagram illustrating one embodiment of a circuit having features of the present invention, including a CML subtractor, a chain of programmable delay elements, a pair of low pass filters (LPF) and an auxiliary amplifier.

FIG. 1 is a simplified schematic diagram illustrating one embodiment of a circuit 10 including a first pair of differential inputs 12, a current-mode logic (CML) subtractor 14, a first pair of differential outputs 16, a feedback calibration loop 18 and a programmable delay elements chain 20 (also sometimes referred to herein simply as a "chain") including one or more delay elements 22 (four delay elements 22 are illustrated in the chain 20 in FIG. 1).

The first pair of differential inputs 12 (also sometimes referred to herein as "circuit input") feed into the CML subtractor 14. In one embodiment, the CML subtractor 14 can have a substantially similar set up as one of the delay elements 22 (described in greater detail below) with the exception that the CML subtractor 14 receives input from the output of the feedback calibration loop 18. The first pair of differential outputs 16 (also sometimes referred to herein as "circuit output") represents the output of the circuit 10.

The feedback calibration loop 18 includes a second pair of differential outputs 24, one or more low pass filters (LPF) 26 (one pair of low pass filters 26 are illustrated in FIG. 1), an auxiliary amplifier 28 (such as an auxiliary fully differential amplifier), a pair of auxiliary amplifier outputs 30 and a second pair of differential inputs 32. The second pair of differential outputs 24 are filtered by the low pass filters 26 and fed into the auxiliary amplifier 28. The auxiliary amplifier outputs 30 are then sent to the CML subtractor 14 as the second pair of differential inputs 32. With this design, the circuit 10 provides a low power solution to continuously calibrate the DC offset of the delay elements chain 20 in the background without disturbing the high speed signal path. The low pass filters 26 can remove some or the entire high frequency component of the output signals passing via the second pair of differential outputs 24 and can increase the likelihood that only near DC signal is fed back into the delay elements chain 20. As a result, the feedback calibration loop 18 only impacts low frequency signal components such as intrinsic DC random offset and does not significantly impact the high speed signal amplification. The auxiliary amplifier 28 provides additional correctional gain to amplify the force of the feedback calibration loop 18 which will reduce the residual DC offset after calibration. The CML subtractor 14 subtracts the DC offset continuously to achieve a DC differential balance in the circuit 10.

Figure 2:
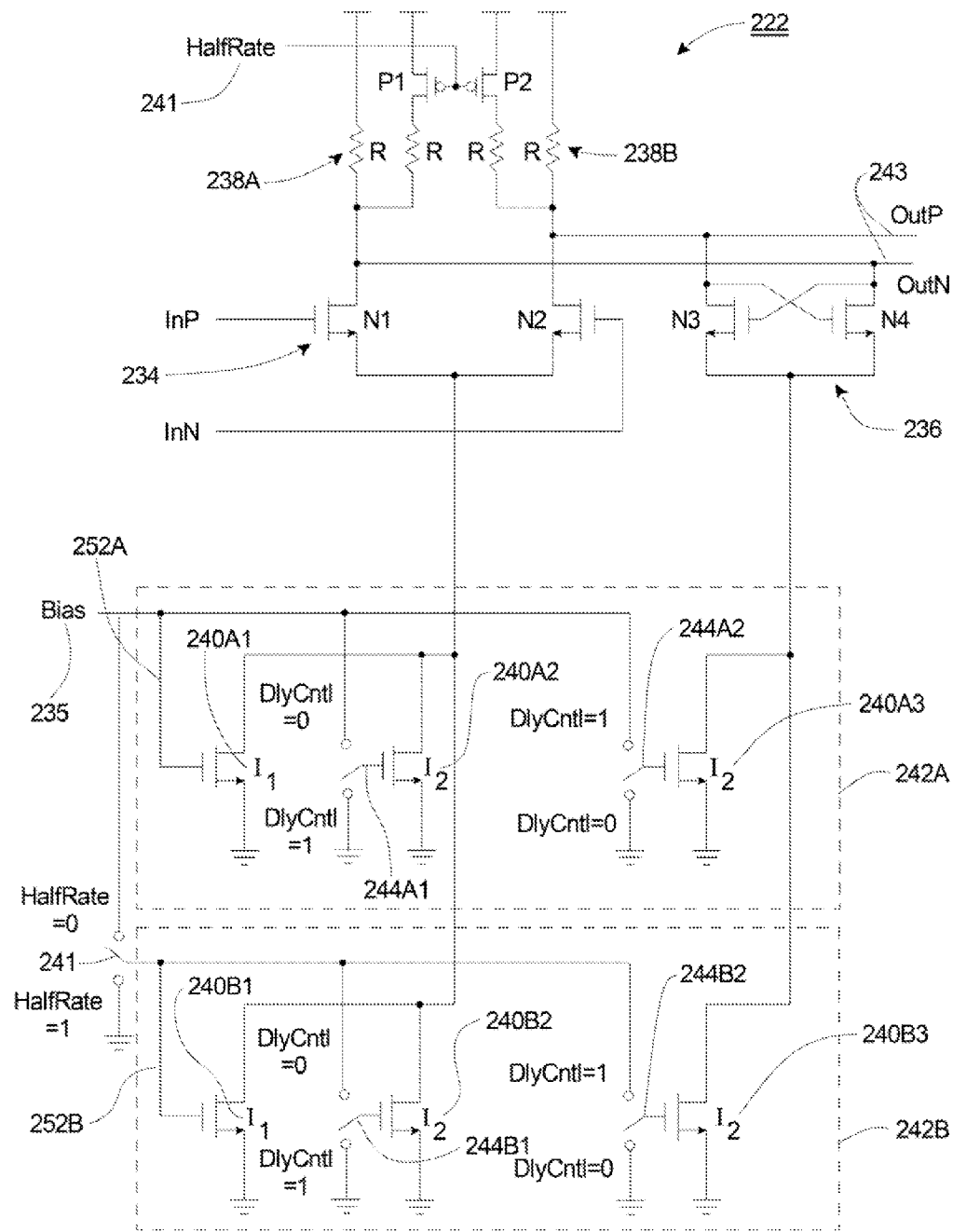
FIG. 2 is a schematic diagram illustrating one embodiment of the delay element.

FIG. 2 is a schematic diagram illustrating one embodiment of a delay element 222 of the circuit 10. In one embodiment, the delay element 222 is essentially a programmable CML amplifier designed specifically to produce one or more desired delay values for the circuit 10. In the embodiment illustrated in FIG. 2, the delay element 222 includes a differential input pair 234, a latch stage 236, one or more sets of resistive loads 238A, 238B (two resistive loads are illustrated in FIG. 2), and a plurality of tail current transistors 240A1, 240A2, 240A3, 240B1, 240B2, 240B3. In the embodiment illustrated in FIG. 2, NMOS transistors N1 and N2 form the differential input pair 234 of the delay element 222. In this embodiment, cross-coupled NMOS transistors N3 and N4 form the latch stage 236 in parallel with the differential input pair 234. In one embodiment, the latch stage 236 can be a positive latch stage.

In one embodiment, two sets of resistive loads 238A, 238B are tied between differential output nodes to provide the desired output swing 243. The resistive loads are controlled by a rate controller 241 (also sometimes referred to herein as "HalfRate switch"). In the embodiment illustrated in FIG. 2, one half of each set of the resistive loads 238A, 238B can be disconnected from the output by setting the rate controller 241 equal to one (and thus, the HalfRate switch is set to 1) to turn off PMOS transistors P1 and P2, which effectively doubles the resistance of the circuit 10. Conversely, when the rate controller 241 is set to zero, the resistive loads 238A, 238B are fully connected, and the resistance of the circuit 10 is effectively one-half that of when the HalfRate switch is set to 1.

Additionally, a bias input voltage 235 (via bias inputs 252A, 252B) is used for the tail current transistors 240A1, 240A2, 240A3, 240B1, 240B2, 240B3, to provide current to the differential input pair 234 and the latch stage 236. In one embodiment, the tail current portion of the circuit 10 can include two substantially identical digital-to-analog converters (DAC) including a first DAC (included in dashed rectangle 242A), and a substantially similar or identical second DAC (included in dashed rectangle 242B), separated by the rate controller 241. In one embodiment, when the rate controller 241 is set to zero, both the first DAC 242A and the second DAC 242B provide full current to the circuit 10. However, when the rate controller 241 is set to one, the second DAC 242B is tied off, and only the first DAC 242A provides current, thereby effectively decreasing the current in the circuit 10 by one-half.

In an alternative embodiment, the first DAC 242A and the second DAC 242B can be different from one another and can receive different levels of current from one another. In this embodiment, when the rate controller 241 is set to zero, both the first DAC 242A and the second DAC 242B provide full current to the circuit 10. However, when the rate controller 241 is set to one, the second DAC 242B is tied off, which can decrease the level of current to the circuit by a factor of greater or less than one-half, depending upon the ratio of current levels to the first DAC 242A and the second DAC 242B.

In the embodiment illustrated in FIG. 2, the first DAC 242A includes three tail current transistors: $I_1$ 240A1, $I_2$ 240A2 and $I_2$ 240A3, and the second DAC 242B includes three tail currents: $I_1$ 240B1, $I_2$ 240B2 and $I_2$ 240B3. In this embodiment, tail currents $I_1$ 240A1, 240B1 are always tied to their respective bias inputs 252A, 252B, and this portion of the current goes to the differential input pair 234.

Of the remaining two currents 240A2, 240A3 and 240B2, 240B3, for each DAC 242A, 242B, respectively, one current 240A2, 240B2, goes to the differential input pair 234, and the remaining current 240A3, 24063, goes to the latch stage 236. In one embodiment, these currents are controlled by a respective delay control switch 244A1, 244A2, 244B1, 244B2 (shown as DlyCntl in FIG. 2, and sometimes referred to herein as "delay controllers"). In certain embodiments, the current $I_2$ 240A2, 240A3 and 240B2, 240B3, for each DAC 242A, 242B, respectively, goes only to either the differential input pair 234 or the latch stage 236, but not both. For example, when the delay controllers 244A1, 244A2, 244B1, 244B2 are set to zero, the current 240A2, 240B2, that goes to the differential input pair 234 is on and the current 240A3, 240B3, that goes to the latch stage 236 is off. When the delay controllers 244A1, 244A2, 244B1, 244B2 are set to one, the current 240A2, 240B2, that goes to the differential input pair 234 is off and the current 240A3, 240B3, that goes to the latch stage 236 is on.

Based on the way the circuit 10 is constructed, each delay element 222 in the chain can be programmed to at least two different modes of operation, including a FullRate mode and a HalfRate mode, to achieve four different delay values. In this embodiment, the FullRate occurs when the HalfRate 241 is set to zero, which effectively provides two base delay values. In this FullRate mode, all four resistors are connected between the differential output nodes. If DlyCntl is set to zero, all of the current 240A1, 240A2, 240B1, 240B2, in the circuit 10 goes to the differential input pair 234, providing the shortest possible delay for this circuit 10.

Conversely, by setting the delay controllers 244A1, 244A2, 244B1, 244B2 to one, a portion (i.e., approximately ⅕ to ⅓, or some other suitable fraction or percentage depending upon the desired value of the delay) of the total current in the circuit 10 is steered to the latch stage 236. In so doing, this slows down the delay (e.g., lengthens the duration of the delay). Additionally, this cleans up inter-symbol interference (131) as it extends the bandwidth and sharpens the edge. The other two delay values are easily achieved by asserting HalfRate (setting rate controller 241 to one), which ties off the second DAC 242B. In this HalfRate mode, the total current used is half (or some other percentage, depending upon the ratio of currents for the first DAC 242A and the second DAC 242B) of that used in FullRate mode. In the HalfRate mode, the same output swing 243 is maintained, and half of the resistive loads 238A, 238B are disconnected from the output nodes, thereby effectively doubling the effective resistance of the circuit 10 versus when the rate controller 241 is set to zero.

In certain embodiments, this HalfRate function is particularly useful as data rates such as 2.5 Gbps/5 Gbps and 3.125 Gbps/6.25 Gbps (or any other data rates at ratios of 1:2, for example) are frequently seen in multiple high speed serial link standards. Additional delay values can also be easily achieved either by introducing extra steps and control bits for both resistive loads 238A, 238B, and tail currents 240A1, 240A2, 240A3, 240B1, 240B2, 240B3, or separately controlling the delay controllers 244A1, 244A2, 244B1, 244B2 and/or rate controller 241 for different delay elements 222 in the chain 20 (illustrated in FIG. 1). Stated another way, each delay element 222 in the chain 20 can be independently programmed and/or controlled, which can provide a more tunable delay value for the circuit 10 as a whole.

Figure 3:
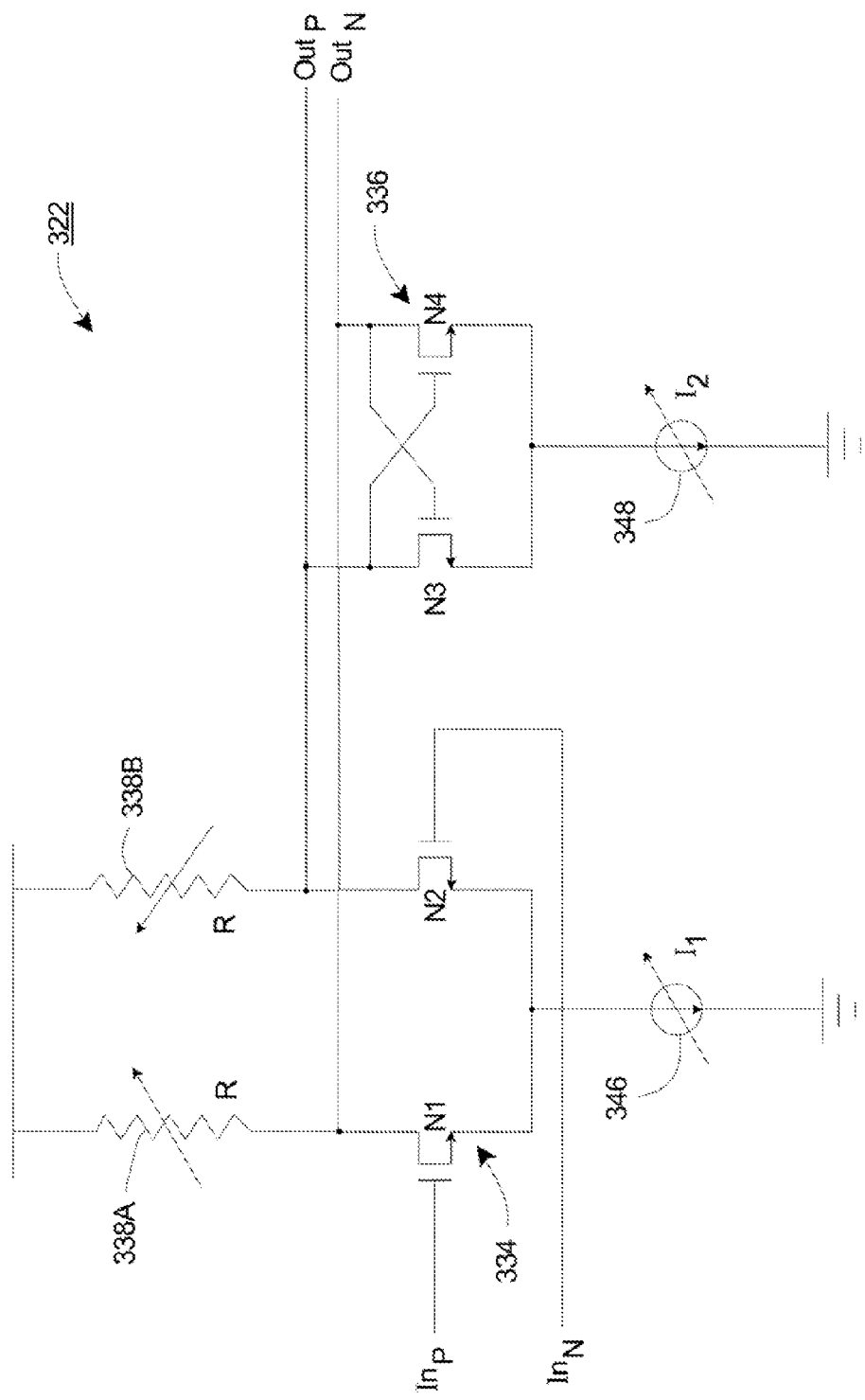
FIG. 3 is a generalized schematic diagram illustrating another embodiment of the delay element.

FIG. 3 is a more generalized schematic diagram illustrating another embodiment of the delay element 322. In this embodiment, the delay element 322 receives a first tail current $I_1$ 346 and a second tail current $I_2$ 348. In the embodiment illustrated in FIG. 3, the first tail current $I_1$ 346 and/or the second tail current $I_2$ 348 can be the result of one or more DACs (not shown in FIG. 3) or any other suitable means of providing current to the circuit 10. In other words, no limitations are implied or intended by the disclosure of the non-exclusive embodiment illustrated in FIG. 2. In the embodiment illustrated in FIG. 3, the first tail current $I_1$ 346 is directed to the differential input pair 334, and the second tail current $I_2$ 348 is directed to the latch stage 336.

Additionally, in the embodiment illustrated in FIG. 3, the resistive loads 338A, 338B are also generalized to indicate that any number or size of resistors can be utilized, either in series or in parallel with one another. In other words, the present invention is in no way limited to using two resistive loads having identical resistors, as illustrated in the non-exclusive example in FIG. 2.

In this embodiment, although not specifically illustrated in FIG. 3, it is recognized that the FullRate and HalfRate features described relative to FIG. 2 can also equally be applied to the embodiment in FIG. 3. Further, or in the alternative, the delay controllers illustrated and described relative to FIG. 2 can also be equally utilized in the embodiment described relative to FIG. 3.

Figure 4:
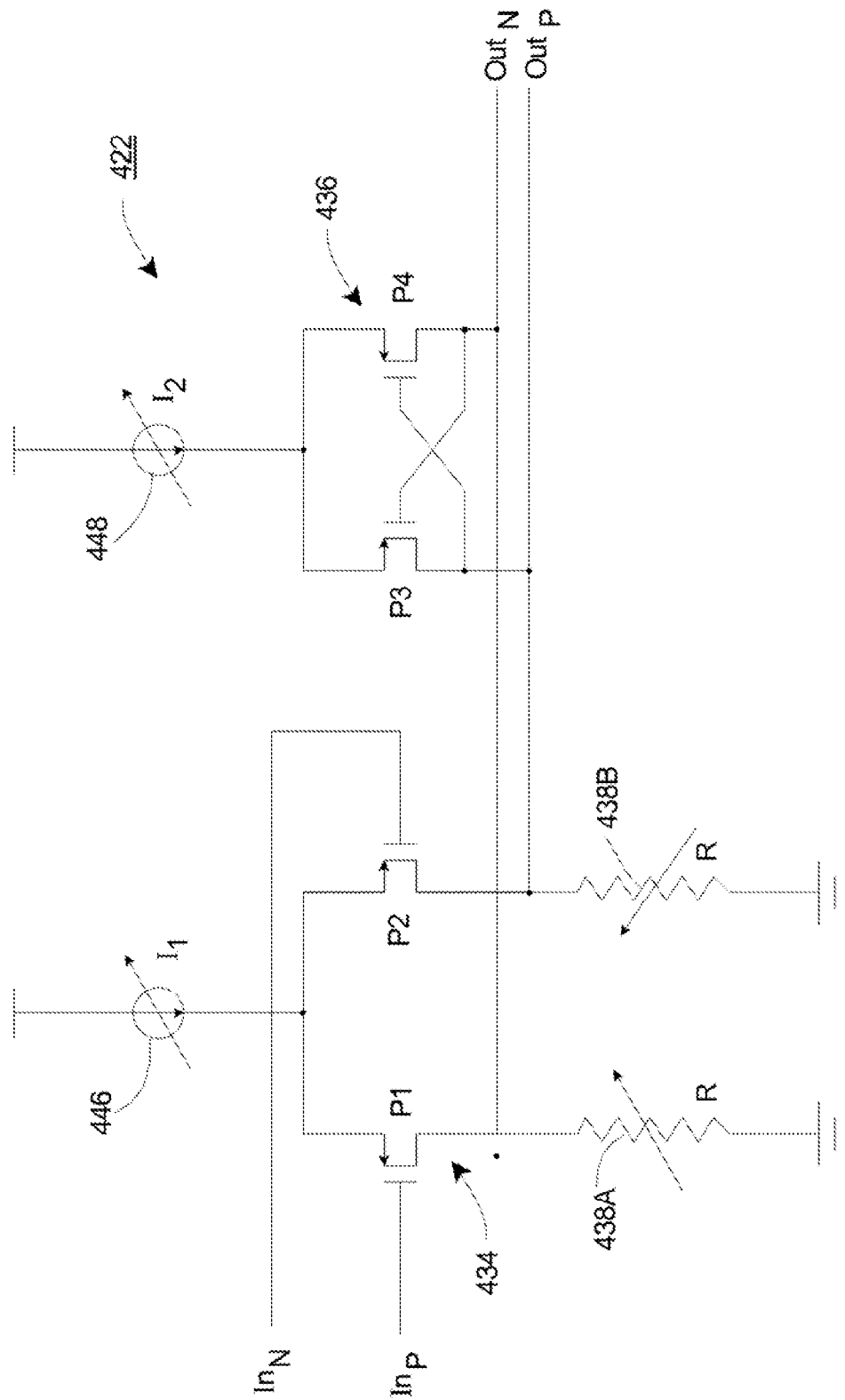
FIG. 4 is a generalized schematic diagram illustrating yet another embodiment of the delay element.

FIG. 4 is a schematic diagram illustrating yet another embodiment of the delay element 422. In this embodiment, all the sub-circuits are referenced to ground, i.e., the CML subtractor 14 (illustrated in FIG. 1) and the delay element 422 will have output resistors 438A, 438B, referenced to ground. In the embodiment illustrated in FIG. 4, the differential input pair 434 includes a PMOS differential pair. Further, or in the alternative, the latch stage 436 includes two cross-coupled PMOS transistors. Additionally, or in the alternative, the tail currents, including the first tail current $I_1$ 446 and the second tail current $I_2$ 448 (i.e. in the form of DACs, as one non-exclusive example) can utilize PMOS devices to source current into the PMOS differential pair 434 and latch stage 436.

While the particular circuit 10 and methods as herein shown and disclosed in detail are fully capable of obtaining the objects and providing the advantages herein before stated, it is to be understood that they are merely illustrative of certain embodiments and that no limitations are intended to the details of construction or design herein shown other than as described in the appended claims.

What is claimed is:

1. A circuit comprising:
   a circuit input;
   a circuit output; and
   a first delay element that is positioned between the circuit input and the circuit output, the first delay element including (i) a differential input pair, (ii) a latch stage that is positioned in parallel with the differential input pair, (iii) a delay controller that selectively apportions current between the differential input pair and the latch stage to achieve a desired delay value for the circuit, (iv) two sets of resistive loads, and (v) a rate controller that controls an on/off state of only a portion of each of the resistive loads by selectively connecting and disconnecting only a portion of each of the resistive loads so that current will still flow through each resistive load even when selectively disconnected.

2. The circuit of claim 1 further comprising a second delay element that is substantially similar to the first delay element, the second delay element being positioned in series with the first delay element.

3. The circuit of claim 2 further comprising a feedback loop that calibrates a DC offset of the first delay element and the second delay element.

4. The circuit of claim 1 further comprising a feedback loop that calibrates a DC offset of the first delay element.

5. The circuit of claim 1 wherein the rate controller controls the resistive loads to selectively switch between full resistance and half resistance.

6. The circuit of claim 1 wherein the rate controller controls the level of current received by the differential input pair.

7. The circuit of claim 6 wherein the rate controller is switchable between allowing full current or half current into the differential input pair.

8. The circuit of claim 1 wherein the latch stage includes gates that are cross-coupled to one another.

9. The circuit of claim 1 wherein the delay controller tunably apportions the current between the differential input pair and the latch stage depending upon the desired delay value.

10. The circuit of claim 9 wherein an increasing level of current directed to the latch stage directly correlates to a greater delay value.

11. The circuit of claim 1 wherein the rate controller controls the level of current received by the latch stage.

12. A method for producing a desired delay value in a circuit, the method comprising the steps of:
positioning a first delay element between a circuit input and a circuit output, the first delay element including two sets of resistive loads and a differential input pair in parallel with a latch stage;
achieving a desired delay value for the circuit by programmably apportioning current between the differential input pair and the latch stage with a delay controller of the first delay element; and
controlling an on/off state of only a portion of each of the resistive loads with a rate controller of the first delay element by selectively connecting and disconnecting only a portion of each of the resistive loads so that current will still flow through each resistive load even when selectively disconnected.

13. The method of claim 12 further comprising the step of positioning a second delay element that is substantially similar to the first delay element in series with the first delay element.

14. The method of claim 13 further comprising the step of calibrating a DC offset of the first delay element and the second delay element using a feedback loop.

15. The method of claim 12 further comprising the step of calibrating a DC offset of the first delay element using a feedback loop.

16. The method of claim 12 wherein the step of controlling includes selectively switching the resistive loads between full resistance and half resistance.

17. The method of claim 12 further comprising the step of controlling the level of current received by the differential input pair with the rate controller.

18. The method of claim 17 wherein the step of controlling the level of current includes selectively switching between allowing full current or half current into the differential input pair with the rate controller.

19. The method of claim 12 wherein an increasing level of current directed to the latch stage directly correlates to a greater delay value.

20. A circuit comprising:
a circuit input;
a circuit output; and
a first delay element that is positioned between the circuit input and the circuit output, the first delay element including:
a differential input pair;
a latch stage that is positioned in parallel with the differential input pair;
a delay controller that selectively apportions current between the differential input pair and the latch stage to achieve a desired delay value for the circuit;
two sets of resistive loads; and
a rate controller that controls (a) an on/off state of only a portion of each of the resistive loads by selectively connecting and disconnecting only a portion of each of the resistive loads so that current will still flow through each resistive load even when selectively disconnected to selectively switch between full resistance and half resistance, and (b) the level of current received by the differential input pair.

21. A circuit comprising:
a circuit input;
a circuit output;
a first delay element that is positioned between the circuit input and the circuit output, the first delay element including (i) a differential input pair, (ii) a latch stage that is positioned in parallel with the differential input pair, and (iii) a delay controller that selectively apportions current between the differential input pair and the latch stage to achieve a desired delay value for the circuit; and
a feedback loop that calibrates a DC offset of the first delay element.

22. The circuit of claim 21 wherein the feedback loop includes at least one low pass filter and an auxiliary amplifier.

23. A method for producing a desired delay value in a circuit, the method comprising the steps of:
positioning a first delay element between a circuit input and a circuit output, the first delay element including a differential input pair in parallel with a latch stage;
achieving a desired delay value for the circuit by programmably apportioning current between the differential input pair and the latch stage with a delay controller of the first delay element; and
calibrating a DC offset of the first delay element using a feedback loop.

24. A circuit comprising:
a circuit input;
a circuit output; and
a first delay element that is positioned between the circuit input and the circuit output, the first delay element including (i) a differential input pair, (ii) a latch stage that is positioned in parallel with the differential input pair, (iii) a delay controller that selectively apportions current between the differential input pair and the latch stage to achieve a desired delay value for the circuit, (iv) two sets of resistive loads, and (v) a rate controller that controls an on/off state of a portion of the resistive loads; wherein the rate controller is positioned in series with the two sets of resistive loads.

25. A method for producing a desired delay value in a circuit, the method comprising the steps of:
positioning a first delay element between a circuit input and a circuit output, the first delay element including a differential input pair in parallel with a latch stage;
achieving a desired delay value for the circuit by programmably apportioning current between the differential input pair and the latch stage with a delay controller of the first delay element; and
controlling an on/off state of at least a portion of two sets of resistive loads with a rate controller of the first delay element; wherein the step of controlling includes positioning the rate controller in series with the two sets of resistive loads.

* * * * *